(12) United States Patent
Forbes

(10) Patent No.: US 6,987,037 B2
(45) Date of Patent: Jan. 17, 2006

(54) STRAINED SI/SIGE STRUCTURES BY ION IMPLANTATION

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/431,134

(22) Filed: May 7, 2003

(65) Prior Publication Data

US 2004/0221792 A1 Nov. 11, 2004

(51) Int. Cl.
*H01L 21/335* (2006.01)
*C30B 1/02* (2006.01)

(52) U.S. Cl. ............................... 438/197; 117/8; 117/9
(58) Field of Classification Search ................ 438/197, 438/526, 528, 486; 257/E21.12, E21.133; 117/8, 9
See application file for complete search history.

(56) References Cited

U.S. PATENT DOCUMENTS

| | | | |
|---|---|---|---|
| 4,241,359 A | 12/1980 | Izumi et al. ................ 257/386 |
| 4,314,595 A | 2/1982 | Yamamoto et al. .......... 148/1.5 |
| 4,589,928 A | 5/1986 | Dalton ........................ 438/142 |
| 4,717,681 A | 1/1988 | Curran ........................ 438/314 |
| 5,426,061 A | 6/1995 | Sopori ........................ 438/475 |
| 5,443,661 A | 8/1995 | Oguro et al. ............. 148/33.5 |
| 5,461,243 A | 10/1995 | Ek et al. ..................... 257/190 |
| 5,646,053 A | 7/1997 | Schepis ...................... 438/402 |
| 5,661,044 A | 8/1997 | Holland et al. ............. 438/766 |
| 5,691,230 A | 11/1997 | Forbes ........................ 437/62 |
| 5,735,949 A * | 4/1998 | Mantl et al. ................... 117/8 |
| 5,759,898 A | 6/1998 | Ek et al. ..................... 438/291 |
| 5,773,152 A | 6/1998 | Okonogi ..................... 428/446 |
| 5,840,590 A | 11/1998 | Myers, Jr. et al. .......... 438/471 |
| 5,879,996 A | 3/1999 | Forbes ........................ 438/289 |
| 5,963,817 A | 10/1999 | Chu et al. ................... 438/410 |
| 5,987,200 A | 11/1999 | Fleming et al. |
| 6,001,711 A | 12/1999 | Hashimoto .................. 438/473 |
| 6,022,793 A | 2/2000 | Wijaranakula et al. ..... 438/473 |
| 6,083,324 A | 7/2000 | Henley et al. ............. 148/33.2 |
| 6,093,623 A | 7/2000 | Forbes ........................ 438/455 |
| 6,093,624 A | 7/2000 | Letavic et al. .............. 438/462 |

(Continued)

FOREIGN PATENT DOCUMENTS

EP 434984 9/1991

OTHER PUBLICATIONS

Lu, Xiang, et al., "SiGe and SiGeC Surface Alloy Formation Using High-Dose Implantation and Solid Phase Epitaxy", IEEE 1997.*

(Continued)

Primary Examiner—George Fourson
(74) Attorney, Agent, or Firm—Schwegman, Lundberg, Woessner & Kluth, P.A.

(57) ABSTRACT

One aspect of this disclosure relates to a method for forming a strained silicon over silicon germanium (Si/SiGe) structure. In various embodiments, germanium ions are implanted into a silicon substrate with a desired dose and energy to be located beneath a surface silicon layer in the substrate. The implantation of germanium ions at least partially amorphizes the surface silicon layer. The substrate is heat treated to regrow a crystalline silicon layer over a resulting silicon germanium layer using a solid phase epitaxial (SPE) process. The crystalline silicon layer is strained by a lattice mismatch between the silicon germanium layer and the crystalline silicon layer. Other aspects are provided herein.

47 Claims, 11 Drawing Sheets

U.S. PATENT DOCUMENTS

| | | | |
|---|---|---|---|
| 6,174,784 B1 | 1/2001 | Forbes | 438/405 |
| 6,204,145 B1 | 3/2001 | Noble | 438/412 |
| 6,228,694 B1 | 5/2001 | Doyle et al. | 438/199 |
| 6,251,751 B1 | 6/2001 | Chu et al. | 438/439 |
| 6,261,876 B1 | 7/2001 | Crowder et al. | 438/149 |
| 6,274,460 B1 | 8/2001 | Delgado et al. | 438/476 |
| 6,309,950 B1 | 10/2001 | Forbes | 438/455 |
| 6,315,826 B1 | 11/2001 | Muramatsu | 117/95 |
| 6,338,805 B1 | 1/2002 | Anderson | 216/89 |
| 6,339,011 B1 | 1/2002 | Gonzalez et al. | 438/473 |
| 6,368,938 B1 | 4/2002 | Usenko | 438/407 |
| 6,376,336 B1 | 4/2002 | Buynoski | 438/476 |
| 6,377,070 B1 | 4/2002 | Forbes | 326/41 |
| 6,424,001 B1 | 7/2002 | Forbes et al. | 257/315 |
| 6,444,534 B1 | 9/2002 | Maszara | 438/31 |
| 6,448,601 B1 | 9/2002 | Forbes et al. | 257/302 |
| 6,455,397 B1 | 9/2002 | Belford | |
| 6,461,933 B2 | 10/2002 | Houston | 438/423 |
| 6,478,883 B1 | 11/2002 | Tamatsuka et al. | 148/33.2 |
| 6,496,034 B2 | 12/2002 | Forbes et al. | 326/41 |
| 6,514,836 B2 | 2/2003 | Belford | |
| 6,515,335 B1 | 2/2003 | Christiansen et al. | 257/347 |
| 6,531,727 B2 | 3/2003 | Forbes et al. | 257/302 |
| 6,538,330 B1 | 3/2003 | Forbes | 257/777 |
| 6,541,356 B2 | 4/2003 | Fogel et al. | 438/480 |
| 6,559,491 B2 | 5/2003 | Forbes et al. | 257/296 |
| 6,566,682 B2 | 5/2003 | Forbes | 257/51 |
| 6,593,625 B2 | 7/2003 | Christiansen et al. | 257/347 |
| 6,597,203 B2 | 7/2003 | Forbes | 326/98 |
| 6,649,476 B2 | 11/2003 | Forbes | 438/268 |
| 6,649,492 B2 | 11/2003 | Chu et al. | |
| 6,689,671 B1 * | 2/2004 | Yu et al. | 438/486 |
| 6,703,293 B2 | 3/2004 | Tweet et al. | 438/518 |
| 6,703,648 B1 | 3/2004 | Xiang et al. | 257/192 |
| 6,740,913 B2 | 5/2004 | Doyle et al. | |
| 6,825,102 B1 * | 11/2004 | Bedell et al. | 438/486 |
| 2002/0001965 A1 | 1/2002 | Forbes | 438/734 |
| 2002/0070421 A1 | 6/2002 | Ashburn | 257/510 |
| 2002/0185686 A1 | 12/2002 | Christiansen et al. | 257/347 |
| 2003/0013323 A1 | 1/2003 | Hammond et al. | 438/981 |
| 2003/0027406 A1 | 2/2003 | Malone | 438/471 |
| 2003/0201468 A1 | 10/2003 | Christiansen et al. | 257/200 |
| 2003/0218189 A1 | 11/2003 | Christiansen et al. | 257/200 |
| 2003/0227072 A1 | 12/2003 | Forbes | 257/616 |
| 2004/0173798 A1 | 9/2004 | Forbes | |
| 2004/0217352 A1 | 11/2004 | Forbes | |
| 2004/0217391 A1 | 11/2004 | Forbes | |
| 2004/0224480 A1 | 11/2004 | Forbes | |
| 2004/0232422 A1 * | 11/2004 | Forbes | 257/63 |
| 2004/0232487 A1 | 11/2004 | Forbes | |
| 2004/0232488 A1 | 11/2004 | Forbes | |
| 2004/0235264 A1 | 11/2004 | Forbes | |
| 2005/0020094 A1 | 1/2005 | Forbes et al. | |
| 2005/0023529 A1 | 2/2005 | Forbes | |
| 2005/0023616 A1 | 2/2005 | Forbes | |
| 2005/0029619 A1 | 2/2005 | Forbes | |
| 2005/0032296 A1 | 2/2005 | Forbes | |

OTHER PUBLICATIONS

Qinghua Xiao et al, "Preparation of Thin Strained Si film by Low Temperature Ge Ion Implantation and High Temperature Annealing", Solid-State and Integrated Circuis Technology, 2004. Proceedings 7th Int'l Conf. pp. 2163-2166.*

Kal, S. et al, "Strained Silicon-SiGe devices Using Germanium Implantation", IETE Journal of Research, vol. 43, No. 2 amd 3, Mar.-Jun. 1997, pp. 185-192.*

Paine et al, "The Growth of Strained Si(1-x)Ge(x) Alloys on <001> Silicon using Solid Phase Epitaxy", J. Mater.Res. vol. 5, No. 5, May 1990, pp. 1023-1031.*

"Cornell Demonstrates a Universal Substrate", *Compound Semiconductor, 3(2)*, (Mar./Apr. 1997),27-29.

Abe, T, "Silicon Wafer-Bonding Process Technology for SOI Structures", *Extended Abstracts of the 22nd(1990 International) Conference on Solid State Devices and Materials*, (1990),853-856.

Auberton-Herve, A J., "SOI: Materials to Systems", *International Electron Devices Meeting, Technical Digest*, (1996),3-10.

Autumn, Kellar, et al., "Adhesive force of a single gecko foot-hair", *Nature, 405(6787)*, (Jun. 2000),681-685.

Autumn, Kellar, et al., "Evidence for van der Waals adhesion in gecko setae.", *Proceedings of the National Academy of Science U S A.; 99(19)*, (Sep. 17, 2002), 12252-6.

Baginski, T. A., "Back-side germanium ion implantation gettering of silicon", *Journal of the Electrochemical Society, 135(7)*, Dept of Electrical Engineering, Auburn Univ, AL, (Jul. 1988), 1842-3.

Belford, Rona E., "Performance-Augmented CMOS Using Back-End Uniaxial Strain", *IEEE Device Research Conference*, (2002), 41-42.

Berti, M. , "Composition and Structure of Si-Ge Layers Produced by Ion Implantation and Laser Melting", *Journal of Materials Research, 6(10)*, (Oct. 1991),2120-2126.

Berti, M. , "Laser Induced Epitaxial Regrowth of Si]-xGEx/Si Layers Produced by Ge Ion Implantation", *Applied Surface Science, 43*, (1989), 158-164.

Bialas, F., et al., "Intrinsic Gettering of 300 mm CZ Wafers", *Microelectronic Engineering, 56(1-2)*, (May 2001), 157-63.

Biever, Celeste , "Secret of 'strained silicon' revealed: behind closed doors, Intel has perfected a novel way to improve chip performance.", *New Scientist, 180(i2426-2428)*, (Dec. 20, 2003),27.

Binns, M. J., et al., "The Realization of Uniform and Reliable Intrinsic Gettering in 200mm P- & P/P Wafers for a Low Thermal Budget 0.18 mu m Advanced CMOS Logic Process", *Diffusion and Defect Data Pt.B: Solid State Phenomena, 82-84*, (2001),387-92.

Bronner, G. B., et al., "Physical Modeling of Backside Gettering", *Impurity Diffusion and Gettering in Silicon Symposium*, Sponsor: Mater. Res. Soc, Nov. 1984, Boston, MA,(1985),27-30.

Brown, Chappell , "Bonding twist hints at universal substrate", *EETimes*, (1997),2 pages.

Bruel, M, et al., "Smart-Cut: a new silicon on insulator material technology based on hydrogen implantation and wafer bonding", *Japanese Journal of Applied Physics, Part 1 (Regular Papers, Short Notes & Review Papers), 36(3B)*, (1997),1636-1641.

Chen, Xiangdong , et al., "Vertical P-MOSFETs with heterojunction between source/drain and channel", *IEEE Device Research Conference*, (2000),25-26.

Chilton, B T., et al., "Solid phase epitaxial regrowth of strained Si(1-x)Ge(x)/Si strained layer structures amorphized by ion implantation", *Applied Physics Letters, 54(1)*, (Jan. 2, 1989),42-44.

Choe, K. S., et al., "Minority-Carrier Lifetime Optimization in Silicon MOS Devices by Intrinsic Gettering", *Journal of Crystal Growth, 218(2-4)*, (Sep. 2000) 239-44.

Clark, Don , et al., "Intel unveils tiny new transistors: Process handles circuits 1/200th the width of a human hair", *The Wall Street Journal*, (Aug. 13, 2002),3pgs.

Clifton, P A., et al., "A process for strained silicon n-channel HMOSFETs", *ESSDERC'96. Proceedings of the 26th European Solid State Device Research Conference*, (Sep. 1996),519-22.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998),13-17.

Fischetti, M V., et al., "Band structure, deformation potentials, and carrier mobility in strained Si, Ge, and SiGe alloys", *Journal of Applied Physics, 80(4)*, (Aug. 15, 1996), 2234-2252.

Fournel, F , et al., "Ultra High Precision Of The Tilt/Twist Misorientation Angles In Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters, 9(1)*, (Jan. 1988),32-34.

Godbole, H. , et al., "An Investigation of Bulk Stacking Faults in Silicon Using Photocapacitance Transient Spectroscophy", *Materials Letters, 8(6-7)*, Dept of Electr & Comput Engr, Oregon State Univ, Corvallis OR,(Jul. 1989), 201-3.

Gong, S. S., et al., "Implantation Gettering in Silicon", *Solid-State Electronics, 30(2)*. (Feb. 1987),209-11.

Graf, D. , et al., "300 mm epi pp- wafer: is there sufficient gettering?", *High Purity Silicon VI. Proceedings of the Sixth International Symposium (Electrochemical Society Proceedings vol. 2000-17)(SPIE vol.4218)*, (2000),319-30.

Haddad, H. , et al., "Carbon Doping Effects on Hot Electron Trapping", *28th Annual Proceedings, Reliability Physics 1990*, (Mar. 1990),288-9.

Haddad, H. , et al., "Electrical Activity of Bulk Stacking Faults in Silicon", *Materials Letters, 7(3)*, Hewlett-Packard Northwest Integrated Circuits Div, Corvallis OR,(Sep. 1988),99-101.

Harendt, Christine , "Silicon on Insulator Material by Wafer Bonding", *Journal of Electronics Materials, 20(3)*, (Mar. 1991),267-77.

Iyer, S S., "Separation by Plasma Implantation of Oxygen (SPIMOX) operational phase space", *IEEE trans. on Plasma Science, 25*, (1997),1128-1135.

Kalavade, Pranav , et al., "A novel sub-10 nm transistor", *58th DRC. Device Research Conference. Conference Digest*, (Jun. 19-21, 2000),71-72.

Kang, J. S., et al., "Gettering in Silicon", *Journal of Applied Physics, 65(8)*, Center for Solid State Electron Res., Arizona State Univ., Tempe, AZ,(Apr. 15, 1989),2974-85.

Kostrzewa, M , et al., "Testing the Feasibility of strain relaxed InAsP and InGaAs compliant substrates", *EMC 2003 International Conference Indium Phosphide and Related Materials. Conference Proceedings*, Other authors: G. Grenet et al,(6/2003),8-9.

Kung, C. Y., et al., "The effect of carbon on oxygen precipitation in high carbon CZ silicon crystals", *Materials Research Bulletin, 18(12)*, Silicon Materials Div., Fairchild Camera & Instrument Corp, Healdsburg, CA,(Dec. 1983), 1437-41.

Lasky, J. B., "Wafer Bonding for Silicon-on-Insulator Technologies", *Applied Physics Letters, 48(1)*, (Jan. 6, 1986),78-80.

LI, Y. X., et al., "New intrinsic gettering process in Czochralski-silicon wafer", *6th International Conference on Solid-State and Integrated Circuit Technology. Proceedings, 1(1)*, (2001),277-9.

Loo, Y L., et al., "Contact Printing with Nanometer Resolution", *Device Research Conference*, (Jun. 2002),149-150.

Lu, D, , "Bonding Silicon Wafers by Use of Electrostatic Fields Followed by Rapid Thermal Heating", *Materials Letters, 4(11)*, (Oct. 1986),461-464.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.

Moran, Peter , "Strain Relaxation in Wafer-Bonded SiGe/Si Heterostructures Due to Viscous Flow of an Underlying Borosilicate Glass", *Electronic Materials Conference, Santa Barbara, Jun. 2002*, Abstract,(Jun. 2002),pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, 1995,28-32.

Nayak, D.K. , "High performance GeSi quantum-well PMOS on SIMOX", *International Electron Devices Metting 1992. Technical Digest*, (1992),777-80.

Nichols, F A., "Surface-(interace) and volume-diffusion contributions to morphological changes driven by capillarity", *Transactions of the American Institute of Mining, Metallurgical and Petroleum Engineers, 233( 10)*, (1965), 1840-8.

O'Neill, A G., et al., "High speed deep sub-micron MOSFET using high mobility strained silicon channel", *ESSDERC '95. Proceedings of the 25th European Solid State Device Research Conference*, (Sep. 1995),109-12.

Or, B S., et al., "Annealing effects of carbon in n-channel LDD MOSFETs", *IEEE Electron Device Letters, 12(11)*, Dept of Electrical & Computing Engr, Oregon State Univ, Corvallis OR, (Nov. 1991),596-8.

Ouyang, Q , et al., "Bandgap Engineering in Deep Submicron Vertical pMOSFETs", *IEEE 58th DRC. Device Research Conference. Conference Digest*, (2000),27-28.

Paine, D. C., "The Growth of Strained Si]-xGex Alloys on (100) Silicon Using Solid Phase Epitaxy", *Journal of Materials Research, 5(5)*, (May 1990),1023-1031.

People, R. , "Calculation of critical layer thickness versus lattice mismatch for GexSi1-x/Si strained-layer heterostructures", *Applied Physics Letters, 47(3)*, (Aug. 1, 1985),322-4.

Rim, Kern , et al., "Fabrication and analysis of deep submicron strained-Si n-MOSFET's", *IEEE Transactions on Electron Devices, 47(7)*, (Jul. 2000),1406-1415.

Rim, Kern, et al., "Strained Si NMOSFETs for High Performance CMOS Technology", *2001 Symposium on VLSI Technology. Digest of Technical Papers*, (2001),59-60.

Rim, Kern , et al., "Transconductance enhancement in deep submicron strained Si n-MOSFETs", *International Electron Devices Meeting 1998. Technical Digest*, (1998),707-710.

Rubin, L , et al., "Effective gettering of oxygen by high dose, high energy boron buried layers", *1998 International Conference on Ion Implantation Technology. Proceedings, 2(2)*, (1998),1010-13.

Sato, T , "A new substrate engineering for the formation of empty space in silicon (ESS) induced by silicon surface migration", *International Electron Devices Meeting 1999. Technical Digest*, (1999),517-20.

Sato, T , "Trench transformation technology using hydrogen annealing for realizing highly reliable device structure with thin dielectric films", *1998 Symposium on VLSI Technology Digest of Technical Papers*, (1998),206-7.

Sugiyama, N , et al., "Formation of strained-silicon layer on thin relaxed-SiGe/SiO/sub 2//Si structure using SIMOX technology", *Thin Solid Films, 369(1-2)*, (Jul. 2000),199-202.

Takagi, Shin-ichi , "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002), 37-40.

Tan, T. Y., et al., "Intrinsic gettering by oxide precipitate induced dislocations in Czochralski Si", *Applied Physics Letters, 30(4)*, IBM System Products Div., Essex Junction, VT,(Feb. 15, 1977),175-6.

Verdonckt-Vandebroek,, Sophie , et al., "SiGe-Channel Heterojunction p-MOSFETs", *IEEE Transactions on Electron Devices, 41(1)*, (Jan. 1994),90-101.

Welser, J , et al., "Strain dependence of the performance enhancement in strained-Si n-MOSFETs", *IEEE International Electron Devices Meeting 1994. Technical Digest*, (Dec. 11-14, 1994),373-376.

Whitwer, F. D., et al., "DLTS characterization of precipitation induced microdefects", *Materials Issues in Silicon Integrated Circuit Processing Symposium*, (Apr. 1986),53-57.

Wijaranakula, W. , et al., "Effect of Pre- and Postepitaxial Deposition Annealing on Oxygen Precipitation in Silicon", *Journal of Materials Research, 1(5)*, Dept of Electr & Comput Eng, Oregon State Univ, Corvallis, OR,(Sep.-Oct. 1986),698-704.

Wijaranakula, W. , et al., "Effect of preanneal heat treatment on oxygen precipitation in epitaxial silicon", *Materials Issues in Silicon Integrated Circuit Processing Symposium*, (Apr. 1986),139-44.

Wijaranakula, W. , et al., "Internal Gettering Heat Treatments and Oxygen Precipitation in Epitaxial Silicon Wafers",*Journal of Materials Research, 1(5)*, Dept of Electr & Comput. Eng, Oregon State Univ., Corvallis, OR,(Sep.-Oct. 1986), 693-7.

Wijaranakula, W. , et al., "Oxygen precipitation in p/p+(100) epitaxial silicon material", *Journal of the Electrochemical Society, 134(9)*, SEH America, Inc., Mater. Characterization Lab., Vancouver, WA,(Sep. 1987),2310-16.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000),67-68.

Yang, D. , et al., "Intrinsic Gettering in Nitrogen Doped Czochralski Crystal Silicon", *High Purity Silicon VI. Proceedings of the Sixth International Symposium (Electrochemical Society Proceedings vo. 2000-17)(SPIE vol.4218)*, (2000),357-61.

Yang, Deren , et al.,"Nitrogen in Czochralski Silicon", *2001 6th International Conference on Solid-State and Integrated Circuit Technology. Proceedings* (2001),255-60.

Yin, Haizhou , "High Ge-Content Relaxed Si1-xGex Layers by Relaxation on Complaint Substrate with Controlled Oxidation", *Electronic Materials Conference, Santa Barbara, Jun. 2002*, (Jun. 2002),8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic device and materials", *IEEE Journal of Selected Topics in Quantum Electronics*, (Jun. 1997),927-936.

* cited by examiner

STRAINED SI/SIGE STRUCTURES BY ION IMPLANTATION

CROSS REFERENCE TO RELATED APPLICATIONS

This application is related to the following commonly assigned U.S. patent applications which are herein incorporated by reference in their entirety: "Output Prediction Logic Circuits With Ultra-Thin Vertical Transistors and Methods of Formation," U.S. application Ser. No. 10/164,611, published as US 20030227072 A1, filed on Jun. 10, 2002; "Micro-Mechanically Strained Semiconductor Film," U.S. application Ser. No. 10/379,749, published as US 20040173798 A1, filed on Mar. 5, 2003; "Localized Strained Semiconductor on Insulator," U.S. application Ser. No. 10/425,797, published as US 20040217391 A1, filed on Apr. 29, 2003; "Strained Semiconductor By Wafer Bonding with Misorientation," U.S. application Ser. No. 10/425,484, published as US 20040217352 A1, filed on Apr. 29, 2003; and "Micromechanical Strained Silicon By Wafer Bonding," U.S. application Ser. No. 10/431,137, published as US 20040224480 A1, filed on May 7, 2003.

TECHNICAL FIELD

This disclosure relates generally to semiconductor structures, and more particularly, to strained silicon on silicon germanium (Si/SiGe) structures.

BACKGROUND

One area of interest for improving the speed and performance of semiconductor devices includes strained silicon technology, which has been shown to enhance carrier mobility in both n-channel and p-channel devices, and is being considered to improve the electron mobility and drift velocity in n-channel MOSFETs in CMOS technology.

There has been considerable research using strained silicon germanium layers on silicon to increase the hole mobility of p-channel CMOS transistors. Thin layers of silicon germanium have been fabricated on silicon because of the tolerance of the thin silicon germanium layers to strain. FIG. 1 illustrates a relationship between elastic strain and semiconductor layer thickness, and indicates that thin layers of silicon germanium on silicon are more tolerant of strain than thick bulk samples. The semiconductor yield is plotted with respect to plastic deformation and defects in bulk samples.

Solid phase epitaxial (SPE) regrowth of silicon on sapphire is known. The SPE regrowth of silicon reduces defects and dislocations that occur during the initial epitaxial deposition of silicon on sapphire because of a large lattice mismatch. A silicon implant amorphizes the initial silicon layer, and regrowth is accomplished at a low temperature. Subsequently, strained layers of silicon germanium have been grown on silicon by SPE.

Silicon germanium layers have been grown on silicon by ion implantation and regrowth by laser melting. Silicon germanium layers have also been formed by ion implantation and regrowth by SPE. The use of ion implantation to form silicon germanium layers, and the use of SPE to regrow layers of silicon germanium on silicon have been described separately and in combination with one another.

Thin layers of strained silicon are being considered for CMOS n-channel devices. Thinner layers of silicon are more tolerant of strain. One technique for producing strained silicon involves epitaxially growing the silicon and silicon germanium layers using an ultra-high vacuum chemical vapor deposition (UHVCVD) process, a costly and complex process, to form silicon layers on relaxed silicon germanium layers. A large mismatch in the cell structure causes a pseudo-morphic layer of silicon on relaxed silicon germanium to be under biaxial tensile strain. The biaxial strain modifies the band structure and enhances carrier transport in the silicon layer.

The strain on the silicon layer depends of the lattice constant difference between silicon and silicon germanium. The lattice constant of silicon germanium is between the lattice constant of silicon (5.43095 Å) and the lattice constant of germanium (5.64613 Å), and depends on the percentage of germanium in the silicon germanium layer. FIG. 2 illustrates the lattice constant of a silicon germanium ($Si_{1-X}Ge_X$) substrate for different percentages (X) of germanium. FIG. 3 illustrates the mobility enhancement for strained silicon for different percentages (X) of germanium in a silicon germanium ($Si_{1-X}Ge_X$) substrate. The mobility enhancement increases as the percentage of germanium increases, and levels off to around 1.6 when the percentage of germanium is around 22% or larger.

There is a need in the art to provide improved methods of forming strained silicon on silicon germanium structures to improve the speed and performance of semiconductor devices such as CMOS n-channel devices.

SUMMARY

The above mentioned problems are addressed and will be understood by reading and studying this specification. Various embodiments of the present invention relate to strained semiconductor films, and to methods of forming the strained semiconductor films along with methods of forming structures and devices that include strained semiconductor films. Various embodiments use ion implantation and solid phase epitaxial (SPE) regrowth to form a strained silicon layer on a silicon germanium layer within a silicon substrate. This method is less costly and complex than the UHVCVD process.

One aspect disclosed herein relates to a method for forming a strained silicon over silicon germanium (Si/SiGe) structure. In various embodiments, germanium ions are implanted into a silicon substrate with a desired dose and energy to form a silicon region containing germanium ions beneath a silicon layer in the substrate. The implantation of germanium ions at least partially amorphizes the silicon layer over the silicon germanium layer. The substrate is heat treated to regrow a crystalline silicon layer over a resulting silicon germanium layer using a solid phase epitaxial (SPE) process. The crystalline silicon layer is strained by a lattice mismatch between the silicon germanium layer and the crystalline silicon layer.

In various embodiments, a silicon substrate is prepared to discourage channeling during ion implantation. Germanium ions are implanted into the silicon substrate with at least a first desired dose and energy and a second desired dose and energy to form a silicon region containing germanium ions with a graded germanium content. The germanium ion implants partially amorphize the silicon layer over the silicon germanium layer, and the silicon layer is further amorphized. The structure is annealed to regrow a crystalline silicon layer over a resulting silicon germanium layer. The crystalline silicon layer is strained by a lattice mismatch between the silicon germanium layer and the crystalline silicon layer.

These and other aspects, embodiments, advantages, and features will become apparent from the following description and the referenced drawings.

DETAILED DESCRIPTION

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Strained silicon is provided using an improved method for forming a strained silicon on silicon germanium structure. The improved method includes implanting germanium ions into a silicon substrate, and performing an SPE process to regrow a crystalline silicon layer over a resulting silicon germanium layer in the substrate.

Figure 1:
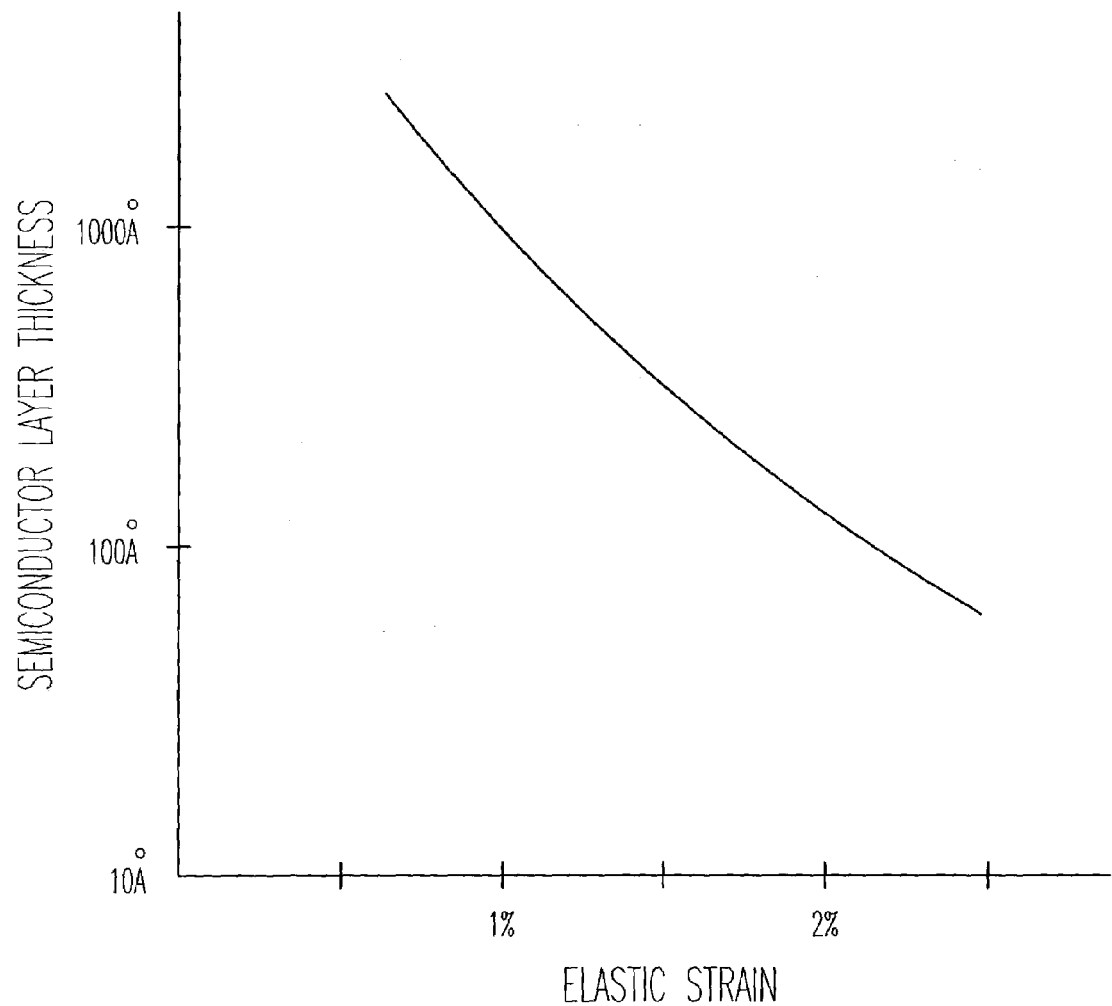
FIG. 1 illustrates a relationship between elastic strain and semiconductor layer thicknesses.
Figure 2:
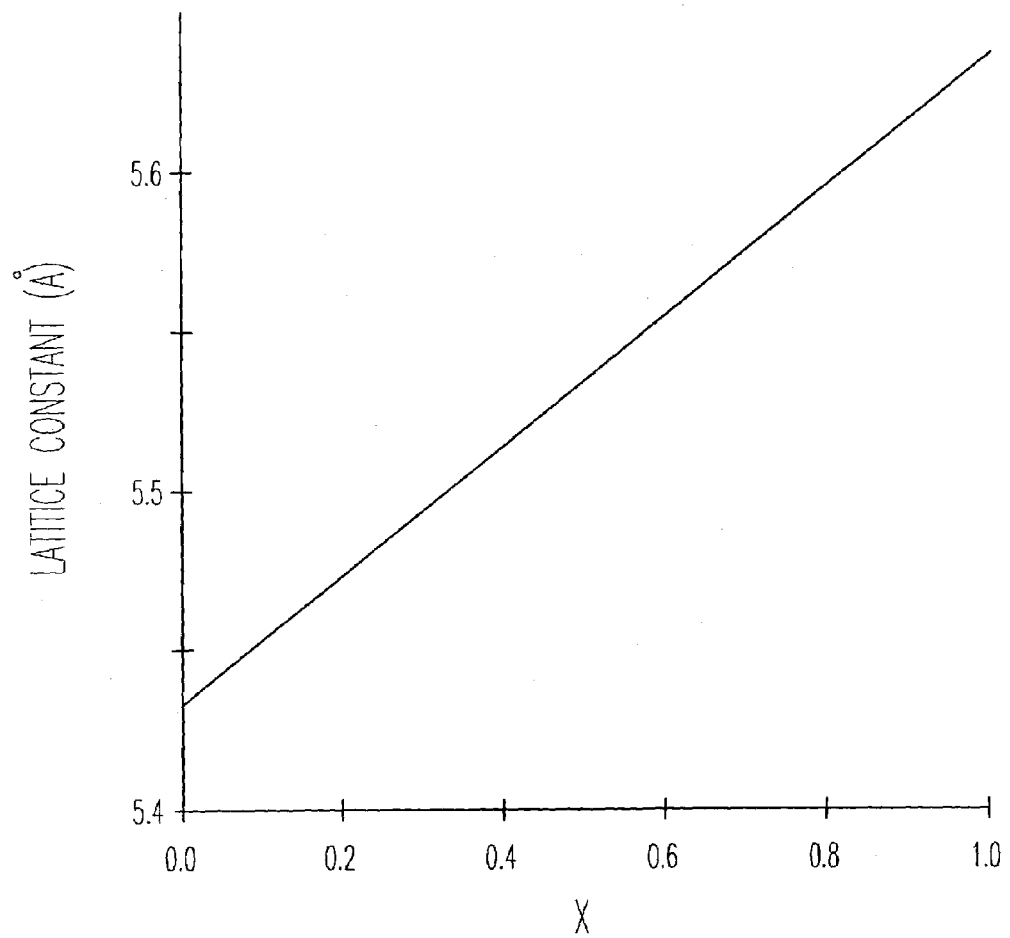
FIG. 2 illustrates the lattice constant of a silicon germanium ($Si_{1-X}Ge_X$) substrate for different percentages (X) of germanium.
Figure 3:
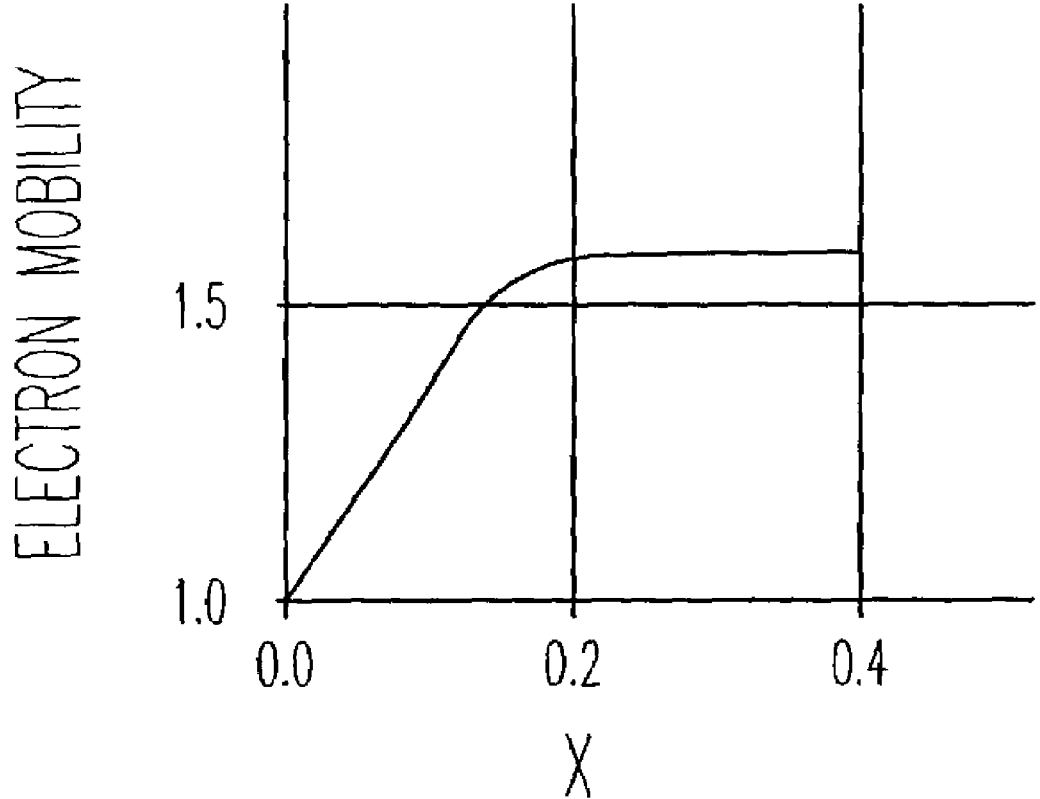
FIG. 3 illustrates the mobility enhancement for strained silicon for different percentages (X) of germanium in a silicon germanium ($Si_{1-X}Ge_X$) substrate.
Figure 4A:
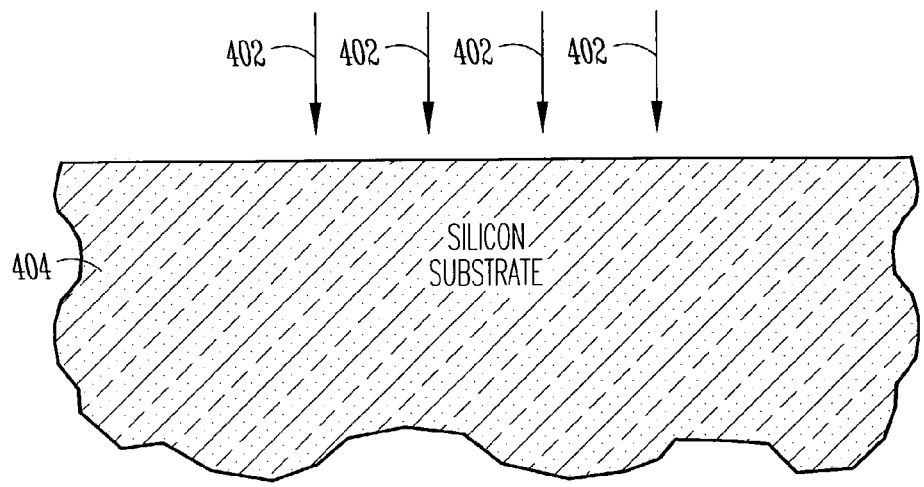
FIGS. 4A–4C illustrate a method of forming a strained silicon on silicon germanium (Si/SiGe) structure by ion implantation, according to various embodiments of the present invention.
Figure 4B:
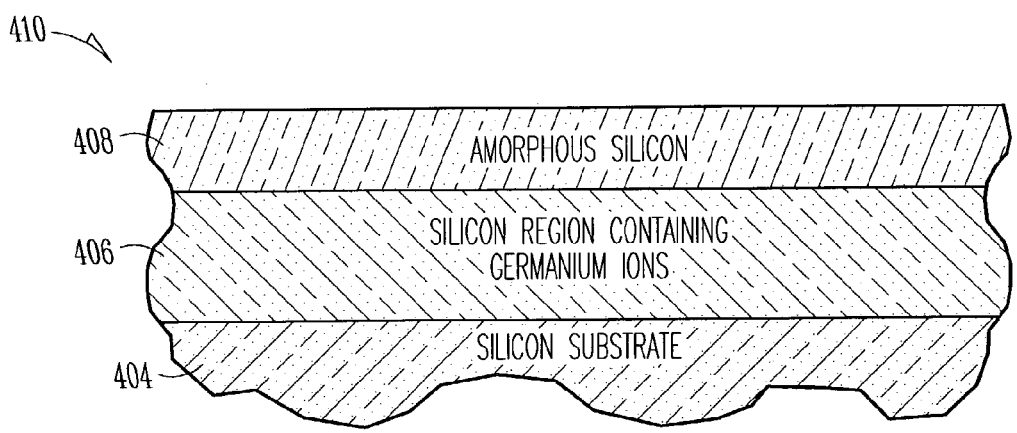
Figure 4C:
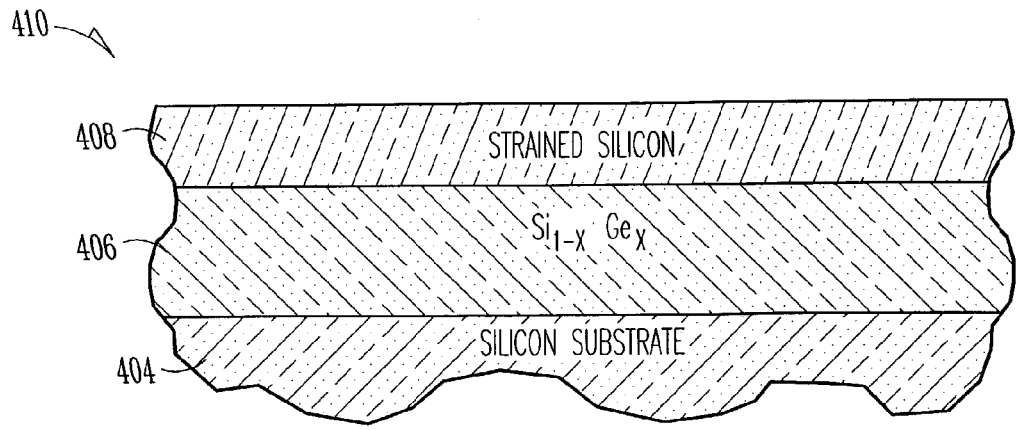

FIGS. 4A–4C illustrate a method of forming a strained silicon on silicon germanium (Si/SiGe) structure by ion implantation, according to various embodiments of the present invention. In the illustrated embodiment, germanium ions 402 are implanted into a p-type silicon wafer 404, as represented in FIG. 4A. In various embodiments, the dose of the germanium ion implant is approximately $10^{20}/cm^2$, and the energy of the germanium ion implant is greater than 200 KeV.

As represented in FIG. 4B, the relatively high dose and energy of the germanium ion implant in the silicon substrate 404 results in a region of silicon that contains germanium ions, represented as 406, on the silicon substrate 404 and further results in an amorphized, or at least a partially amorphized, silicon layer 408 at the surface. In various embodiments, if the germanium ion implant did not completely amorphize the surface silicon layer, a silicon ion implant is used to further amorphize the silicon layer. In various embodiments, the dose of this silicon ion implant to amorphize the silicon layer 408 is approximately $10^{15}/cm^2$ and the energy of this silicon ion implant is approximately 170 KeV.

During an ion implantation process, the ions can channel along the crystal directions of the substrate, such that the ions do not encounter nuclei and are slowed down mainly by electronic stopping. Channeling can be difficult to control, and can cause the ions to penetrate several times deeper than intended. In various embodiments, to avoid channeling during the germanium ion implant, the silicon substrate is amorphized using a silicon ion implant to prepare the substrate for the germanium ion implant. In various embodiments, the dose of this silicon ion implant is approximately $10^{15}/cm^2$ and the energy of this silicon ion implant is greater than 170 KeV. Preparing the substrate using the silicon ion implant to amorphize the substrate results in better depth control during the germanium ion implant process.

The structure 410 is heat treated, or annealed, such that the amorphized layers are regrown by a solid phase epitaxy (SPE) process. In various embodiments, the SPE process involves heating the structures at temperatures within a range of approximately 550° C. to 700° C. for a time within a range from approximately one hour to approximately two hours. The resulting structure 410 is illustrated in FIG. 4C. The silicon region that contains germanium ions forms a silicon germanium ($Si_{1-X}Ge_X$) layer 406 and the amorphous silicon layer regrows into a crystalline silicon layer 408 over the silicon germanium layer 406. In various embodiments, the crystalline silicon layer is approximately 20 nm thick. However, the present invention is not limited to a particular thickness. The thickness of the crystalline silicon layer is controlled by the energy of the implant. One of ordinary skill in the art will understand, upon reading and comprehending this disclosure, how to control the germanium implant to achieve a desired thickness of the crystalline silicon layer 408.

The lattice mismatch of the silicon surface layer with the underlying silicon germanium layer 406 causes the silicon layer 408 to be strained. In various embodiments, N-channel CMOS devices are fabricated in this strained silicon layer 408 using conventional techniques, which are not described here for the sake of brevity.

One of ordinary skill in the art will understand, upon reading and comprehending this disclosure, that the concentration (X) of germanium in the silicon is controlled by the dose and energy of the germanium ion implant process. Additionally, one of ordinary skill in the art will understand, upon reading and comprehending this disclosure, that the concentration (X) of germanium in the silicon can be graded by controlling the dose and energy of two or more germanium ion implant process. A benefit of grading germanium concentration involves forming a silicon germanium layer on a silicon substrate to have a relaxed silicon germanium surface upon which the crystalline silicon layer is regrown.

Figure 5:
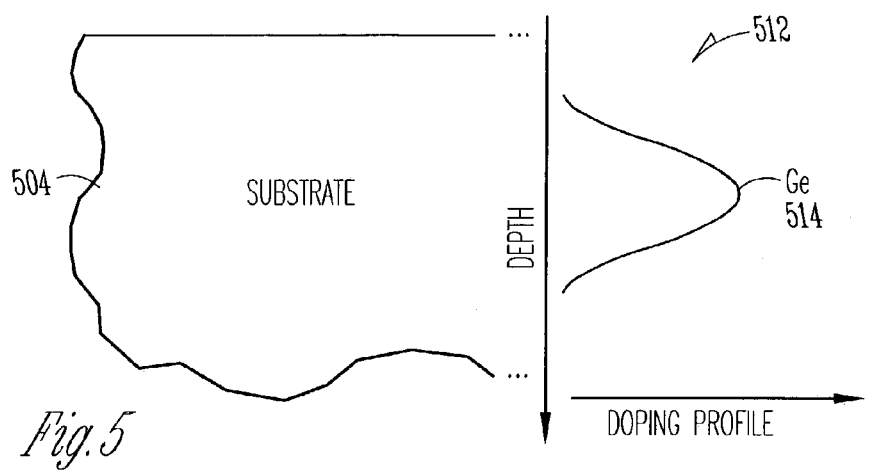
FIG. 5 illustrates a doping profile for the strained silicon on silicon germanium (Si/SiGe) structure of FIG. 4C in which a single germanium implant process provides the silicon germanium layer, according to various embodiments of the present invention.

FIG. 5 illustrates a doping profile for the strained silicon on silicon germanium (Si/SiGe) structure of FIG. 4C in which a single germanium implant process provides the silicon germanium layer, according to various embodiments of the present invention. The left side of the figure illustrates a silicon substrate 504, and the right side of the figure represents a germanium ion doping profile 512. The profile 512 illustrates a single germanium ion implantation process step 514, in which germanium ions are implanted at a desired dose and energy to form the silicon region containing germanium ions, represented at 406 in FIG. 4B.

Figure 6:
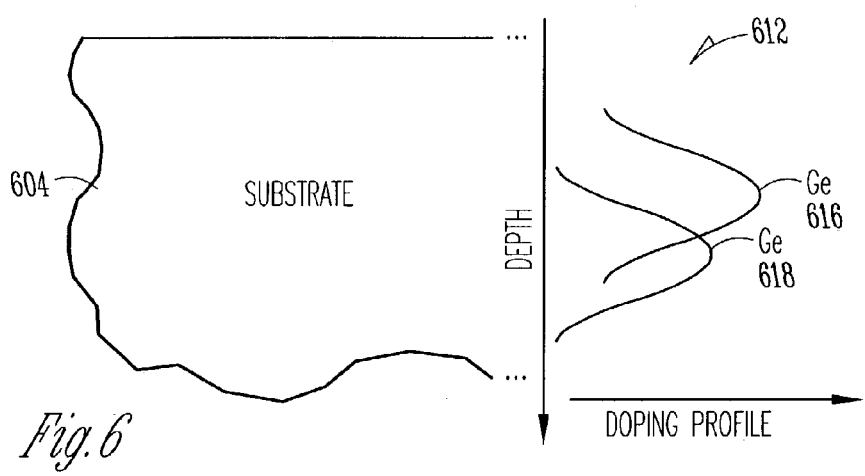
FIG. 6 illustrates a doping profile for the strained silicon on silicon germanium (Si/SiGe) structure of FIG. 4C in which multiple germanium implants provide a graded germanium concentration, according to various embodiments of the present invention.

FIG. 6 illustrates a doping profile for the strained silicon on silicon germanium (Si/SiGe) structure of FIG. 4C in which multiple germanium implant steps provide a graded germanium concentration, according to various embodiments of the present invention. The left side of the figure illustrates a silicon substrate 604, and the right side of the figure represents a germanium ion doping profile 612. The profile 612 illustrates a first germanium ion implantation process step 616 in which germanium ions are implanted at a first desired dose and energy and a second germanium ion implantation step 618 in which germanium ions are implanted at a second desired dose and energy. These germanium ion implant steps form the silicon region containing germanium ions, represented at 406 in FIG. 4B. The concentration of the germanium in the silicon is graded. One of ordinary skill in the art will appreciate, upon reading and comprehending this disclosure, that additional germanium ion implant steps can be performed to control the germanium concentration, and that a relaxed silicon germanium layer can be formed by appropriately grading the germanium ion content such that less germanium ions are implanted near the silicon substrate, and more and more germanium ions are implanted closer to the silicon layer. One of ordinary skill in the art will appreciate, upon reading and comprehending this disclosure, that without grading the germanium concentration, the resulting silicon germanium layer has a slight strain attributable to the lattice mismatch of the silicon germanium layer and the silicon substrate beneath the silicon germanium layer. Various embodiments include silicon on silicon germanium layer that have a relaxed surface and that have a slightly strained surface.

Figure 7:
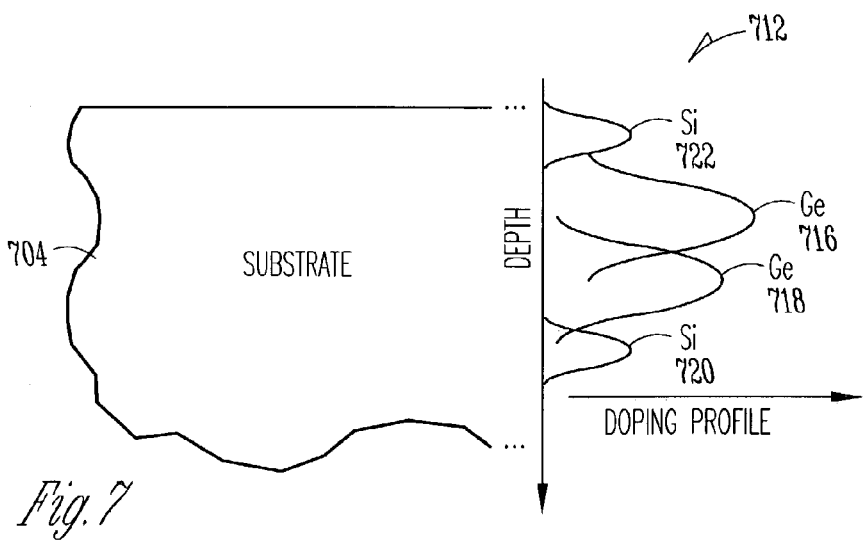
FIG. 7 illustrates a doping profile for the strained silicon on silicon germanium (Si/SiGe) structure of FIG. 4C in which multiple germanium implants provide a graded germanium concentration, a first silicon implant reduces germanium ion channeling, and a second silicon implant further amorphizes the silicon layer, according to various embodiments of the present subject mater.

FIG. 7 illustrates a doping profile for the strained silicon on silicon germanium (Si/SiGe) structure of FIG. 4C in which multiple germanium implant steps provide a graded germanium concentration, a first silicon implant reduces germanium ion channeling, and a second silicon implant further amorphizes the silicon layer, according to various embodiments of the present invention. The left side of the figure illustrates a silicon substrate 704 and the right side of the figure illustrates a doping profile 712. The first silicon implant 720 prepares the silicon substrate 704 for the germanium ion implantation by amorphizing the substrate to a desired depth. Thus, undesirable channeling is reduced, and the depth of the germanium ion implants 716 and 718 can be more accurately controlled. As discussed above with respect to FIG. 6, the multiple germanium ion implant steps provide a graded germanium concentration, which results in a relaxed, or at least partially relaxed, silicon germanium surface upon which a crystalline silicon layer is regrown from an amorphized silicon layer located over the silicon region that contains germanium ions. The implantation of the germanium ions at least partially amorphizes the silicon layer. The second silicon implant 722 further amorphizes the silicon layer in preparation for regrowing the crystalline silicon layer.

Figure 8A:
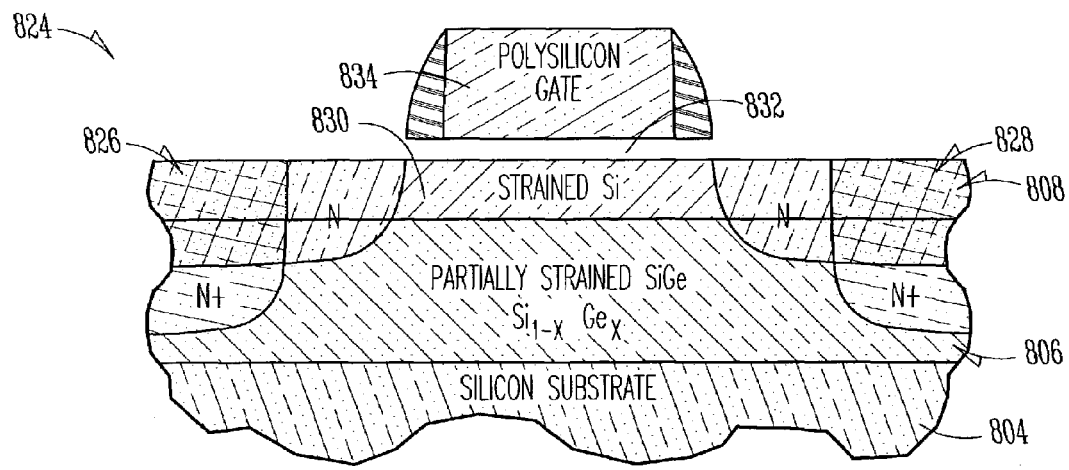
FIGS. 8A–8B illustrate a transistor structure with a strained silicon layer on a partially strained silicon germanium layer and with a strained silicon layer on a relaxed silicon germanium layer having a graded germanium concentration, respectively, according to various embodiments of the present invention.
Figure 8B:
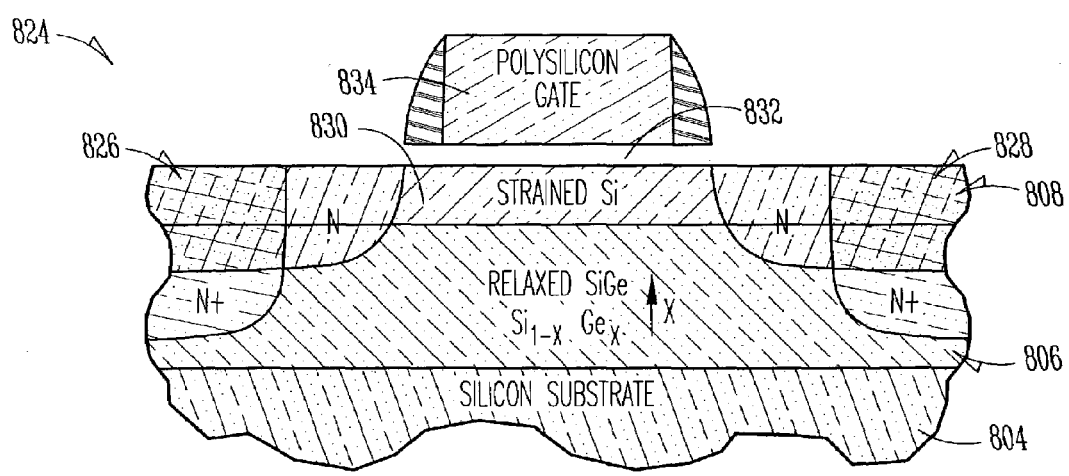

FIGS. 8A–8B illustrate a transistor structure with a strained silicon layer on a partially strained silicon germanium layer and with a strained silicon layer on a relaxed silicon germanium layer having a graded germanium concentration, respectively, according to various embodiments of the present invention. Both FIGS. 8A and 8B illustrate a transistor structure 824 formed on a p-type silicon substrate 804. A silicon germanium layer ($Si_{1-X}Ge_X$) 806 is positioned over the silicon substrate 804, and a strained silicon layer 808 is positioned over the silicon germanium layer ($Si_{1-X}Ge_X$) layer. The formation of the silicon germanium ($Si_{1-X}Ge_X$) layer 806 and the strained silicon layer 808 has been described above. First and second diffusion regions 826 and 828 are formed by implanting n-type impurities. The illustrated structures show each diffusion region with an n-type area and an n+ type area. The illustrated diffusion regions are formed in the strained silicon layer, and extend into the silicon germanium layer. The strained silicon layer 808 forms a channel region 830 which extends between the diffusion regions 826 and 828. Thus, the channel region 830 possesses the electron mobility enhancement associated with strained silicon. A gate dielectric 832 (such as a gate oxide), is formed over the channel region 830, and a gate 834 is formed over the gate dielectric 832 to control electron current through the channel region 830 between the n-type diffusion regions 826 and 828.

The silicon germanium layer 806 in the structure illustrated in FIG. 8A is formed without grading the germanium ion content. The lattice mismatch of the silicon substrate 804 beneath the silicon germanium layer 806 causes the surface of the silicon germanium layer to be partially strained. The silicon formed over the partially strained silicon germanium layer is still strained.

The germanium ion content is graded to form the relaxed silicon germanium layer 806 in the structure illustrated in FIG. 8B. As represented by the arrow and the reference "X", the germanium content increases further away from the silicon substrate. This grading of the germanium content reduces the effect that the lattice mismatch between the silicon substrate 804 and the silicon germanium layer 806. Thus, the surface of the silicon germanium layer is relaxed, or at least partially relaxed. The crystalline silicon layer 808 formed over the relaxed silicon germanium layer 806 is strained.

Upon reading and comprehending this disclosure, one of ordinary skill in the art will appreciate the benefits. The strained silicon layer improves the electron mobility in the n-channel transistors in CMOS technology. A pseudo-morphic layer of silicon on relaxed silicon germanium is under biaxial tensile strain, which modifies the band structure and enhances carrier transport. In an electron inversion layer, the subband splitting is large in strained silicon because of the strain-induced band splitting in addition to that provided by quantum confinement. The ground level splitting in a MOS inversion layer at 1 MV/cm transverse field is about 120 and 250 meV for unstrained and strained silicon, respectively. The increase in energy splitting reduces inter-valley scattering and enhances NMOSFET mobility, as demonstrated at low (<0.6 MV/cm) and higher (approximately 1 MV/cm) vertical fields. The scaled $g_m$ is also improved due to the reduced density of states and enhanced non-equilibrium transport. The germanium content can be graded in steps to form a fully relaxed silicon germanium buffer layer before a thin strained silicon channel layer is grown. X-ray diffraction analysis is used to quantify the germanium content (15 and 20%) and strain relaxation in the silicon germanium layer. The strain state of the silicon channel layer can be confirmed by Raman spectroscopy.

Figure 9:
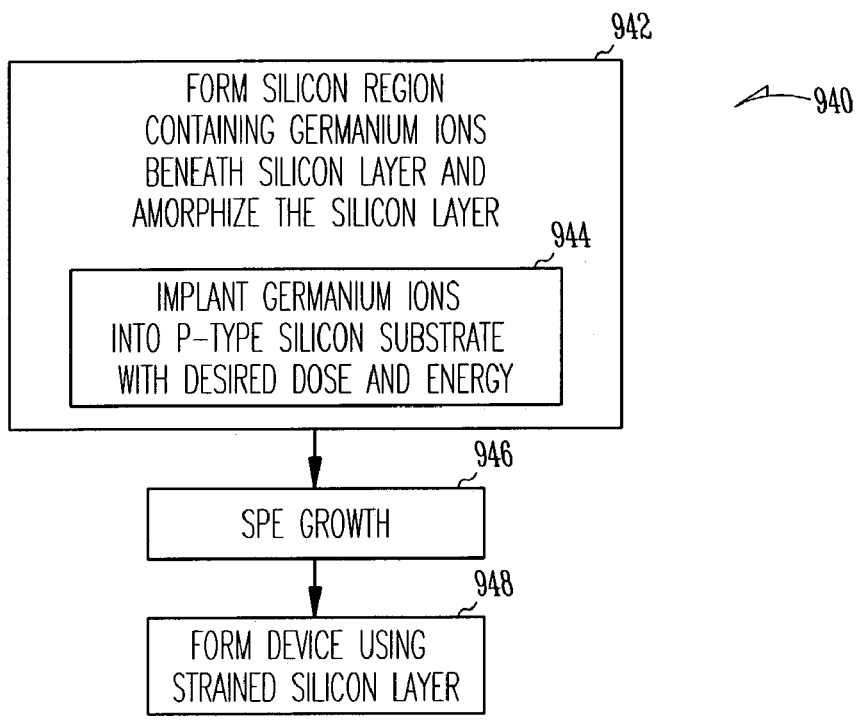
FIG. 9 illustrates a method for forming a device with a strained Si layer, according to various embodiments of the present invention.

FIG. 9 illustrates a method for forming a device with a strained silicon layer, according to various embodiments of the present invention. In various embodiments of the method 940, a silicon region containing germanium ions is formed beneath a silicon layer, and the silicon layer over the silicon region containing germanium ions is amorphized, as represented at 942. In various embodiments, as represented at 944, germanium ions are implanted into a p-type silicon substrate with a desired dose and energy to form the silicon region containing germanium ions. The implantation of the germanium ions also amorphizes, or at least partially amorphizes, the silicon layer over the silicon region containing germanium ions. At 946, a solid phase epitaxy (SPE) growth process is performed to form a crystalline silicon layer over a silicon germanium region. The lattice mismatch between the crystalline silicon layer and the silicon germanium causes the crystalline silicon layer to be strained. At 948, a device is formed using the strained silicon layer.

Figure 10:
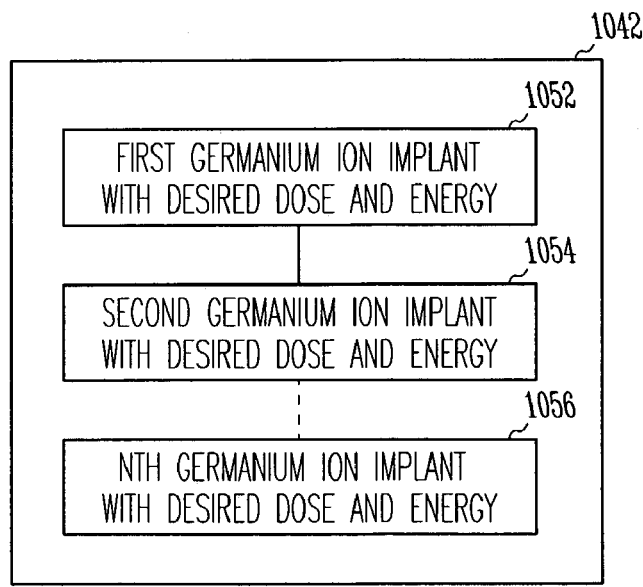
FIG. 10 illustrates a method for amorphizing the silicon layer and forming a silicon germanium layer beneath the silicon layer, according to various embodiments of the present invention.

FIG. 10 illustrates a method for forming a silicon region containing germanium ions beneath a silicon layer, and amorphizing the silicon layer over the silicon region containing germanium ions, according to various embodiments of the present invention. The illustrated method is represented generally at 1042, which generally corresponds to 942 in FIG. 9. At 1052, a first germanium ion implant is performed with a first desired dose and energy. At 1054, a second germanium ion implant is performed with a second desired dose and energy. Additional germanium implants can be performed according to various embodiments. Thus, the figure illustrates, at 1056, an Nth germanium ion implant performed with an nth desired does and energy. The illustrated method is useful to create a silicon region with a graded concentration of germanium ions, such that upon annealing, a resulting silicon germanium layer has a desired graded germanium concentration.

Figure 11:
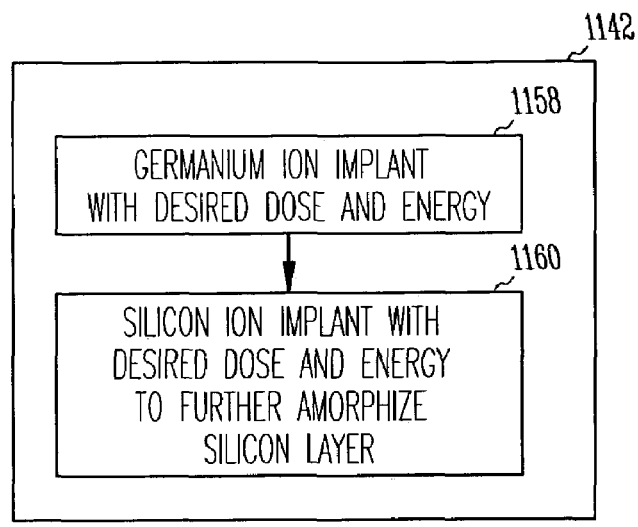
FIG. 11 illustrates a method for forming a silicon region containing germanium ions beneath a silicon layer, and amorphizing the silicon layer over the silicon region containing germanium ions, according to various embodiments of the present invention.

FIG. 11 illustrates a method for forming a silicon region containing germanium ions beneath a silicon layer, and amorphizing the silicon layer over the silicon region containing germanium ions, according to various embodiments of the present invention. The illustrated method is represented generally at 1142, which generally corresponds to 942 in FIG. 9. At 1158, a germanium ion implant is performed with a desired dose and energy to form a silicon region containing germanium ions within a silicon substrate. This germanium ion implant partially amorphizes the silicon layer positioned over the silicon region containing germanium ions. At 1160, a silicon ion implant is performed with a desired dose and energy to further amorphize the silicon layer in preparation for the SPE growth process, illustrated at 946 in FIG. 9.

Figure 12:
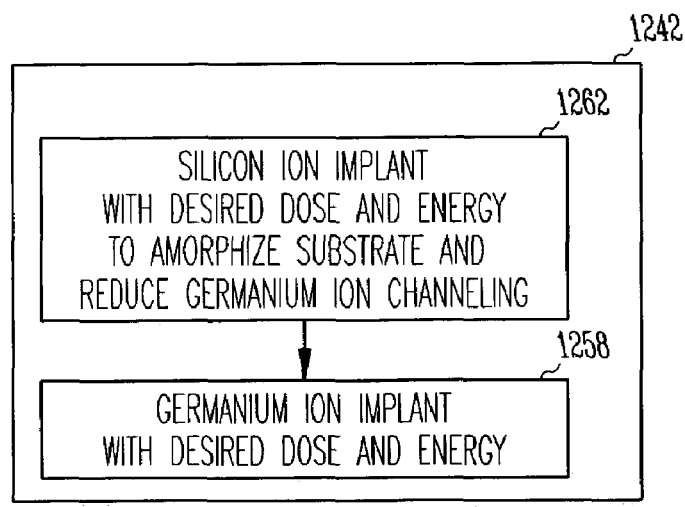
FIG. 12 illustrates a method for forming a silicon region containing germanium ions beneath a silicon layer, and amorphizing the silicon layer over the silicon region containing germanium ions, according to various embodiments of the present invention.

FIG. 12 illustrates a method for forming a silicon region containing germanium ions beneath a silicon layer, and amorphizing the silicon layer over the silicon region containing germanium ions, according to various embodiments of the present invention. The illustrated method is represented generally at 1242, which generally corresponds to 942 in FIG. 9. At 1262, a silicon ion implant is performed with a desired dose and energy to prepare the silicon substrate for germanium ion implantation. The silicon ion implant amorphizes the silicon substrate to a desired depth to reduce channeling of the germanium ions. At 1258, a germanium ion implant is performed with a desired dose and energy to form a silicon region containing germanium ions within the amorphized silicon substrate. Reducing the unpredictable channeling by amorphizing the substrate permits better control of the depth of the germanium ion implant.

Figure 13:
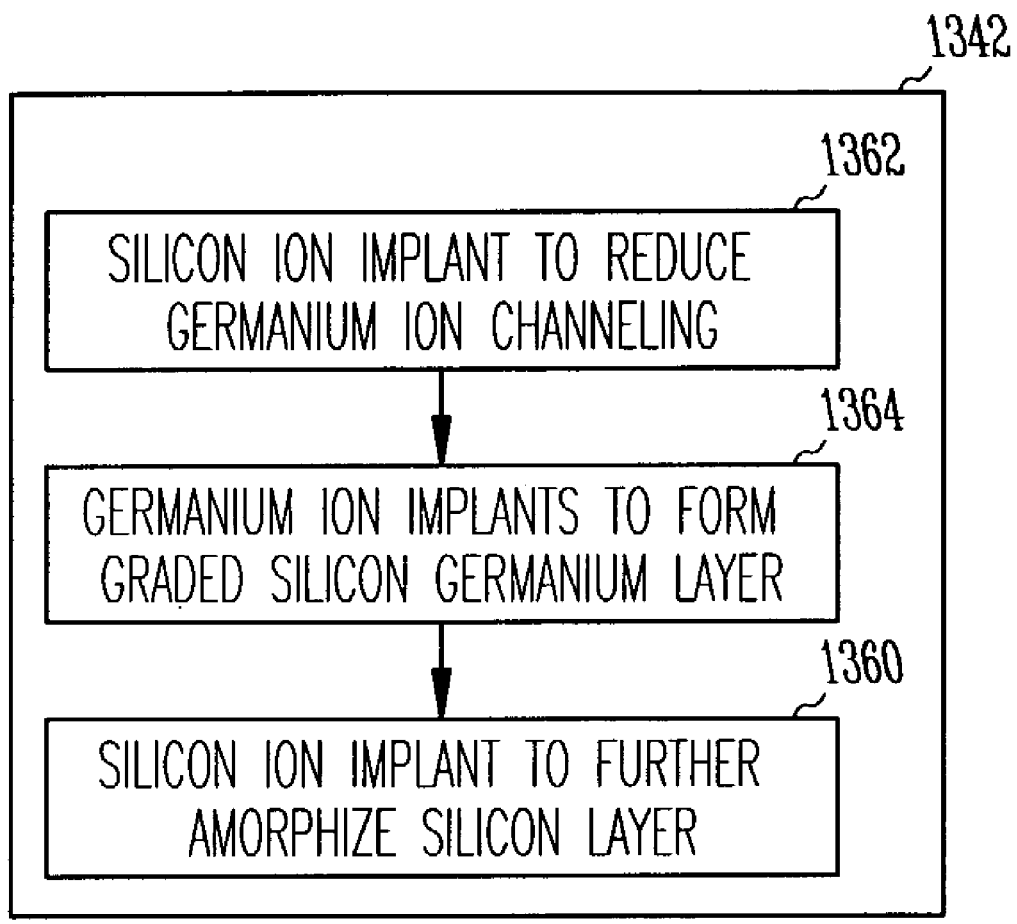
FIG. 13 illustrates a method for forming a silicon region containing germanium ions beneath a silicon layer, and amorphizing the silicon layer over the silicon region containing germanium ions, according to various embodiments of the present invention.

FIG. 13 illustrates a method for forming a silicon region containing germanium ions beneath a silicon layer, and amorphizing the silicon layer over the silicon region containing germanium ions, according to various embodiments of the present invention. The illustrated method is represented generally at 1342, which generally corresponds to 942 in FIG. 9. At 1362, a first silicon ion implant is performed with a desired dose and energy to prepare the silicon substrate for germanium ion implantation. The silicon ion implant amorphizes the silicon substrate to a desired depth to reduce channeling of the germanium ions. At 1364, a number of germanium ion implant steps are performed to create a silicon region with a graded concentration of germanium ions in the amorphized silicon substrate, such that upon annealing, a resulting silicon germanium layer has a desired graded germanium concentration. The first silicon implant reduces the unpredictable channeling and permits better control of the depth of the germanium ion implants These germanium ion implant steps at least partially amorphizes the silicon layer positioned over the silicon region containing germanium ions. At 1360, a second silicon ion implant is performed with a desired dose and energy to further amorphize the silicon layer in preparation for the SPE growth process, illustrated at 946 in FIG. 9.

Figure 14:
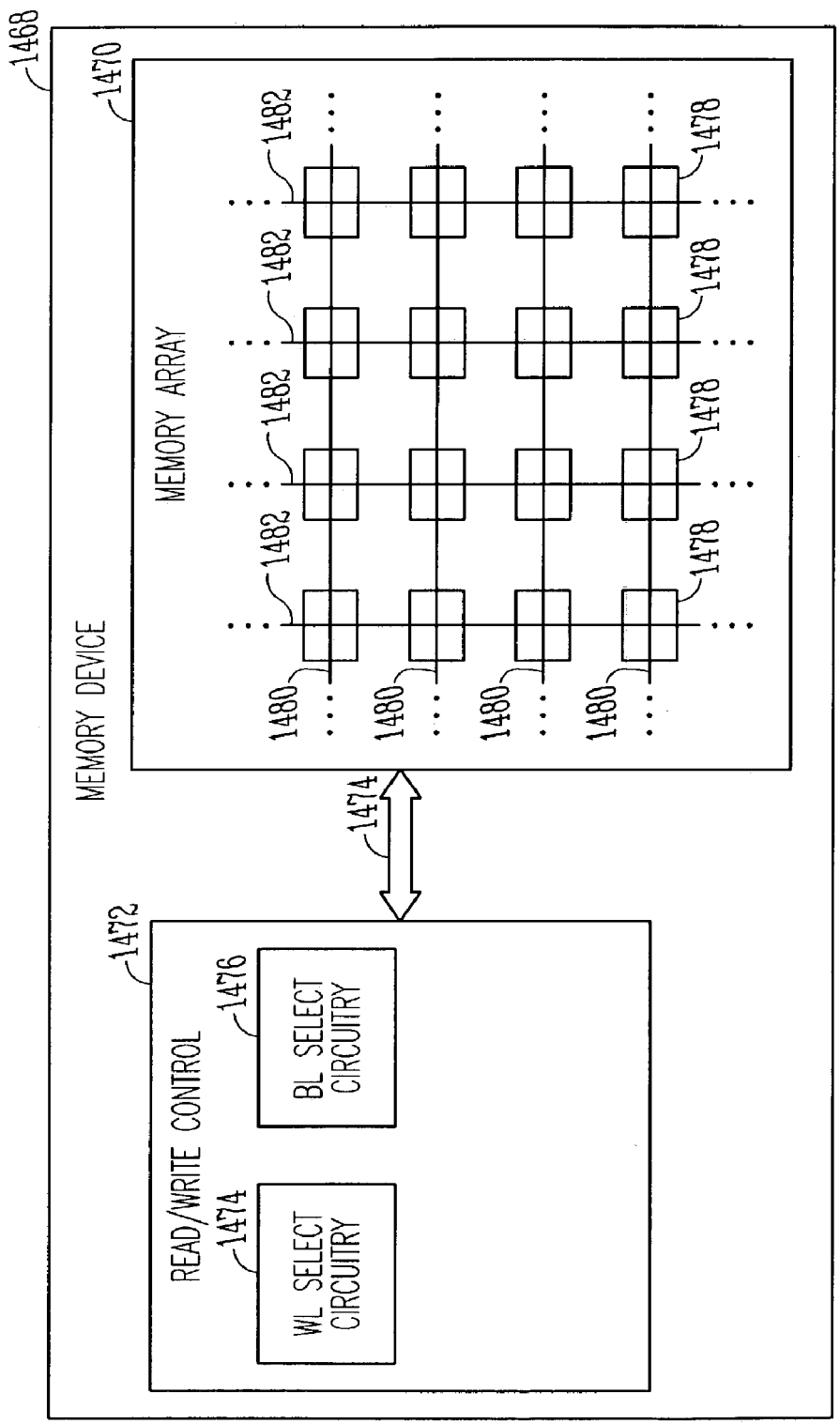
FIG. 14 is a simplified block diagram of a high-level organization of various embodiments of a memory device according to various embodiments of the present invention.

FIG. 14 is a simplified block diagram of a high-level organization of various embodiments of a memory device according to various embodiments of the present invention. The illustrated memory device 1468 includes a memory array 1470 and read/write control circuitry 1472 to perform operations on the memory array via communication line(s) 1474. The illustrated memory device 1468 may be a memory card or a memory module such as a single inline memory module (SIMM) and dual inline memory module (DIMM). One of ordinary skill in the art will understand, upon reading and comprehending this disclosure, that semiconductor components in the memory array 1470 and/or the control circuitry 1472 are able to be fabricated using the strained semiconductor films, as described above. For example, in various embodiments, the memory array 1470 and/or the control circuitry 1472 include transistors with strained body layers formed using a strained silicon on silicon germanium (Si/SiGe) structure. The structure and fabrication methods for these strained body layers have been described above.

The memory array 1470 includes a number of memory cells 1478. The memory cells in the array are arranged in rows and columns. In various embodiments, word lines 1480 connect the memory cells in the rows, and bit lines 1482 connect the memory cells in the columns. The read/write control circuitry 1472 includes word line select circuitry 1474, which functions to select a desired row. The read/write control circuitry 1472 further includes bit line select circuitry 1476, which functions to select a desired column.

Figure 15:
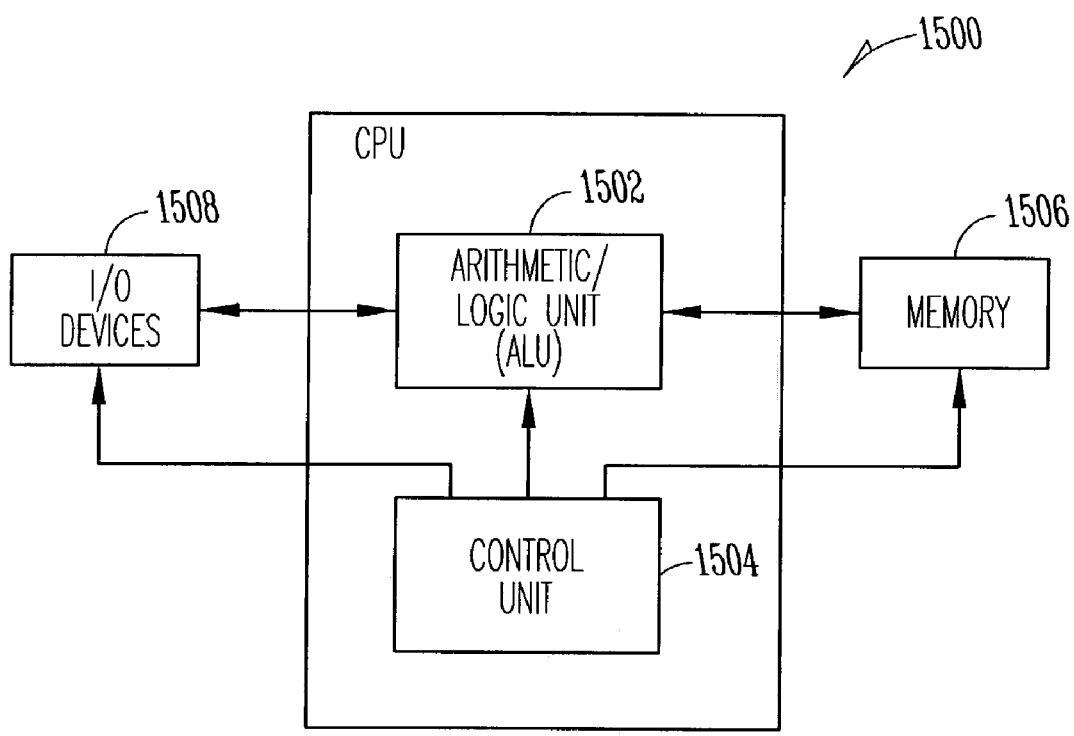
FIG. 15 is a simplified block diagram of a high-level organization of various embodiments of an electronic system according to the present invention.

FIG. 15 is a simplified block diagram of a high-level organization of various embodiments of an electronic system according to the present invention. In various embodiments, the system 1500 is a computer system, a process control system or other system that employs a processor and associated memory. The electronic system 1500 has functional elements, including a processor or arithmetic/logic unit (ALU) 1502, a control unit 1504, a memory device unit 1506 (such as illustrated in FIG. 14) and an input/output (I/O) device 1508. Generally such an electronic system 1500 will have a native set of instructions that specify operations to be performed on data by the processor 1502 and other interactions between the processor 1502, the memory device unit 1506 and the I/O devices 1508. The control unit 1504 coordinates all operations of the processor 1502, the memory device 1506 and the I/O devices 1508 by continuously cycling through a set of operations that cause instructions to be fetched from the memory device 1506 and executed. According to various embodiments, the memory device 1506 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include strained silicon on silicon germanium (Si/SiGe) in accordance with various embodiments of the present invention.

The illustration of the system 1500 is intended to provide a general understanding of one application for the structure and circuitry, and is not intended to serve as a complete description of all the elements and features of an electronic system using strained semiconductor films according to the various embodiments of the present invention. As one of ordinary skill in the art will understand, such an electronic system can be fabricated in single-package processing units, or even on a single semiconductor chip, in order to reduce the communication time between the processor and the memory device.

Applications containing strained semiconductor films, such as transistors with a strained semiconductor body layer, as described in this disclosure include electronic systems for use in memory modules, device drivers, power modules, communication modems, processor modules, and application-specific modules, and may include multilayer, multi-chip modules. Such circuitry can further be a subcomponent of a variety of electronic systems.

CONCLUSION

Various embodiments disclosed herein provide strained silicon over silicon germanium (Si/SiGe) structures, and provide low cost means for straining silicon using ion implantation and solid phase epitaxy (SPE) processes. Various embodiments implant germanium ions into a silicon substrate with a desired dose and energy in one or more process steps. A silicon layer over the implanted germanium ions is at least partially amorphized by the implant. The structure is heat treated to regrow a crystalline silicon layer over a resulting silicon germanium layer such that the crystalline silicon layer is strained by a lattice mismatch. This low cost process has significant advantages over the costly and complex ultra-high vacuum chemical vapor deposition (UHVCVD) process used to epitaxially grow a silicon germanium layer and a silicon layer on the silicon germanium layer.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for forming a strained silicon over silicon germanium (Si/SiGe) structure, comprising:
   implanting germanium ions into a silicon substrate with a desired dose and energy to form a silicon region containing germanium ions beneath a silicon layer in the substrate and to at least partially amorphize the silicon layer; and
   heat treating the substrate to regrow a crystalline silicon layer over a resulting silicon germanium layer using a solid phase epitaxial (SPE) process, the crystalline silicon layer being strained by a lattice mismatch between the silicon germanium layer and the crystalline silicon layer.

2. The method of claim 1, wherein implanting germanium ions into a silicon substrate with a desired dose and energy to form a silicon germanium layer includes implanting germanium ions in a desired manner to form the silicon germanium layer with a partially strained surface upon which the crystalline silicon layer is regrown.

3. The method of claim 1, wherein implanting germanium ions into a silicon substrate with a desired dose and energy to form a silicon germanium layer includes implanting germanium ions in a desired manner to form the silicon germanium layer with a relaxed surface upon which the crystalline silicon layer is regrown.

4. A method for forming a strained silicon over silicon germanium (Si/SiGe) structure, comprising:
   implanting germanium ions into a silicon substrate with at least a first desired dose and energy and a second desired dose and energy to form a silicon region containing germanium ions beneath a silicon layer in the substrate and to at least partially amorphize the silicon layer, the first desired dose and energy and the second desired dose and energy providing a graded germanium concentration; and
   heat treating the substrate to regrow a crystalline silicon layer over a resulting silicon germanium layer using a solid phase epitaxial (SPE) process, the crystalline silicon layer being strained by a lattice mismatch between the silicon germanium layer and the crystalline silicon layer.

5. The method of claim 4, further comprising further amorphizing the silicon layer over the silicon germanium layer before heat treating the substrate.

6. The method of claim 4, further comprising preparing the substrate to discourage ion channeling before implanting germanium ions into the silicon substrate.

7. The method of claim 4, wherein the silicon germanium layer with a graded germanium concentration has a relaxed surface upon which the crystalline silicon layer is regrown.

8. A method for forming a strained silicon over silicon germanium (Si/SiGe) structure, comprising:
   implanting silicon ions with a desired dose and a desired energy into a silicon substrate to amorphize the silicon substrate to a desired depth to discourage channeling during ion implantation;
   implanting germanium ions with a desired dose and a desired energy into the amorphized silicon substrate to form a silicon region containing germanium ions beneath an amorphized silicon layer in the substrate; and
   heat treating the substrate to regrow a crystalline silicon layer over a resulting silicon germanium layer using a solid phase epitaxial (SPE) process, the crystalline silicon layer being strained by a lattice mismatch between the silicon germanium layer and the crystalline silicon layer.

9. The method of claim 8, wherein implanting germanium ions into a silicon substrate includes performing two or more germanium ion implants where each germanium ion implant has a desired dose and energy such that the two or more germanium ion implants provide a desired graded germanium content.

10. A method for forming a strained silicon over silicon germanium (Si/SiGe) structure, comprising:
    implanting germanium ions into a silicon substrate with a desired dose and energy to form a silicon region containing germanium ions beneath a silicon layer in the substrate and to at least partially amorphize the silicon layer;
    implanting silicon ions with a desired dose and energy to further amorphize the silicon layer; and
    heat treating the substrate to regrow a crystalline silicon layer over a resulting silicon germanium layer using a solid phase epitaxial (SPE) process, the crystalline silicon layer being strained by a lattice mismatch between the silicon germanium layer and the crystalline silicon layer.

11. The method of claim 10, wherein implanting germanium ions into a silicon substrate includes performing two or more germanium ion implants where each germanium ion implant has a desired dose and energy such that the two or more germanium ion implants provide a desired graded germanium content.

12. The method of claim 10, further comprising preparing the substrate to discourage ion channeling before implanting germanium ions into the silicon substrate.

13. A method for forming a strained silicon over silicon germanium (Si/SiGe) structure, comprising:
    implanting silicon ions with a desired dose and a desired energy into a silicon substrate to amorphize the silicon substrate to a desired depth to discourage ion implant channeling;
    implanting germanium ions into the silicon substrate with at least a first desired dose and energy and a second desired dose and energy to form a silicon region containing germanium ions beneath a silicon layer in the substrate and to at least partially amorphize the silicon layer, the first desired dose and energy and the second desired dose and energy providing a graded germanium concentration;
    implanting silicon ions with a desired dose and energy to further amorphize the silicon layer; and
    heat treating the substrate to regrow a crystalline silicon layer over a resulting silicon germanium layer using a solid phase epitaxial (SPE) process, the crystalline silicon layer being strained by a lattice mismatch between the silicon germanium layer and the crystalline silicon layer.

14. The method of claim 13, wherein the silicon germanium layer with a graded germanium concentration provides the silicon germanium layer with a relaxed surface upon which the crystalline silicon layer is regrown.

15. A method for forming a strained silicon over silicon germanium (Si/SiGe) structure, comprising:
    forming a silicon germanium layer beneath a silicon layer of a silicon substrate, including implanting germanium ions into the silicon substrate with a desired dose and energy, wherein the germanium ion implant at least partially amorphizes the silicon layer; and
    annealing the silicon layer to regrow a crystalline silicon layer over the silicon germanium layer, the crystalline silicon layer being strained by a lattice mismatch between the silicon germanium layer and the crystalline silicon layer, further comprising:
    before implanting germanium ions, preparing the silicon substrate to discourage germanium ion channeling; and
    after implanting germanium ions and before annealing, further amorphizing the silicon layer.

16. A method for forming a strained silicon over silicon germanium (Si/SiGe) structure, comprising:
    forming a silicon germanium layer beneath a silicon layer of a silicon substrate, including forming the silicon germanium layer with a graded germanium content, including implanting germanium ions into the silicon substrate with at least a first desired dose and energy and a second desired dose and energy, wherein the germanium ion implants at least partially amorphize the silicon layer; and
    annealing the silicon layer to regrow a crystalline silicon layer over the silicon germanium layer, the crystalline silicon layer being strained by a lattice mismatch between the silicon germanium layer and the crystalline silicon layer, and further comprising:
before implanting germanium ions, preparing the silicon substrate to discourage germanium ion channeling; and
after implanting germanium ions and before annealing, further amorphizing the silicon layer.

17. A method for forming a strained silicon over silicon germanium (Si/SiGe) structure, comprising:
preparing a silicon substrate to discourage channeling during ion implantation;
forming a silicon germanium layer beneath a silicon layer in the silicon substrate, including implanting germanium ions into the silicon substrate with a desired dose and energy, wherein the germanium ion implant at least partially amorphizes the silicon layer; and
annealing the silicon layer to regrow a crystalline silicon layer over the silicon germanium layer, the crystalline silicon layer being strained by a lattice mismatch between the silicon germanium layer and the crystalline silicon layer.

18. The method of claim 17, wherein preparing a silicon substrate to discourage channeling during ion implantation includes implanting silicon ions with a desired dose and a desired energy into a silicon substrate to amorphize the silicon substrate to a desired depth.

19. A method for forming a strained silicon over silicon germanium (Si/SiGe) structure, comprising:
forming a silicon germanium layer beneath a silicon layer of a silicon substrate, including implanting germanium ions into the silicon substrate with a desired dose and energy, wherein the germanium ion implant partially amorphizes the silicon layer;
further amorphizing the silicon layer over the silicon germanium layer; and
annealing the silicon layer to regrow a crystalline silicon layer over the silicon germanium layer, the crystalline silicon layer being strained by a lattice mismatch between the silicon germanium layer and the crystalline silicon layer.

20. A method for forming a strained silicon over silicon germanium (Si/SiGe) structure, comprising:
preparing a silicon substrate to discourage channeling during ion implantation;
forming a silicon germanium layer beneath a silicon layer of a silicon substrate, including forming the silicon germanium layer with a graded germanium content, including implanting germanium ions into the silicon substrate with at least a first desired dose and energy and a second desired dose and energy, wherein the germanium ion implants amorphize the silicon layer;
further amorphizing the silicon layer over the silicon germanium layer; and
annealing the silicon layer to regrow a crystalline silicon layer over the silicon germanium layer, the crystalline silicon layer being strained by a lattice mismatch between the silicon germanium layer and the crystalline silicon layer.

21. The method of claim 20, wherein implanting germanium ions into the silicon substrate with at least a first desired dose and energy and a second desired dose and energy forms the silicon germanium layer with a relaxed surface upon which the crystalline silicon layer is regrown.

22. The method of claim 20, wherein preparing a silicon substrate to discourage channeling during ion implantation include implanting silicon ions with a desired dose and a desired energy into a silicon substrate to amorphize the silicon substrate to a desired depth.

23. The method of claim 20, wherein further amorphizing the silicon layer over the silicon germanium layer includes implanting silicon ions with a desired dose and a desired energy into the silicon layer.

24. A method for forming a transistor, comprising:
implanting germanium ions into a silicon substrate with a desired dose and energy to form a silicon region containing germanium ions beneath a silicon layer in the substrate and to at least partially amorphize the silicon layer over the silicon germanium layer;
annealing the substrate to regrow a crystalline silicon layer over a resulting silicon germanium layer such that the crystalline silicon layer is strained by a lattice mismatch between the silicon germanium layer;
forming a first diffusion region and a second diffusion region in the substrate, the first and second diffusion regions being separated by a channel region formed in the strained silicon layer;
forming a gate dielectric over the channel region; and
forming a gate over the gate dielectric.

25. The method of claim 24, wherein forming a first diffusion region and a second diffusion region in the substrate includes doping the substrate with n-type impurities to form the first and second diffusion regions.

26. The method of claim 25, wherein doping the substrate with n-type impurities to form the first and second diffusion regions includes doping a portion of the strained silicon and a portion of the silicon germanium layer with n-type impurities.

27. The method of claim 24, wherein implanting germanium ions into a silicon substrate with a desired dose and energy includes forming the silicon germanium layer with a partially strained surface upon which the crystalline silicon layer is regrown.

28. The method of claim 24, wherein implanting germanium ions into a silicon substrate with a desired dose and energy includes forming the silicon germanium layer with a relaxed surface upon which the crystalline silicon layer is regrown.

29. The method of claim 24, further comprising:
before implanting germanium ions, preparing the silicon substrate to discourage germanium ion channeling; and
after implanting germanium ions and before annealing, further amorphizing the silicon layer.

30. A method for forming a transistor, comprising:
forming a relaxed silicon germanium layer with a graded germanium content in a silicon substrate beneath a silicon layer in the substrate, including implanting germanium ions into the silicon substrate with a first desired dose and energy and a second desired dose and energy which at least partially amorphizes the silicon layer;
regrowing a crystalline silicon layer over the silicon germanium layer using a solid phase epitaxy (SPE) process, the crystalline silicon layer being strained by a lattice mismatch between the silicon layer and the silicon germanium layer;
forming a first diffusion region and a second diffusion region in the substrate, the first and second diffusion regions being separated by a channel region formed in the crystalline silicon layer;
forming a gate dielectric over the channel region; and
forming a gate over the gate dielectric.

31. The method of claim 30, wherein forming a first diffusion region and a second diffusion region in the substrate includes doping the substrate with n-type impurities to form the first and second diffusion regions.

32. The method of claim 31, wherein doping the substrate with n-type impurities to form the first and second diffusion regions includes doping a portion of the strained silicon and a portion of the silicon germanium layer with n-type impurities.

33. A method for forming a transistor, comprising:
preparing a silicon substrate for germanium ion implantation, including implanting silicon ions at a desired dose and energy to amorphize the silicon substrate to a desired depth to discourage channeling;
forming a silicon germanium layer in a silicon substrate beneath a silicon layer in the substrate, including implanting germanium ions into the silicon substrate with a desired dose and energy which at least partially amorphizes the silicon layer over the silicon germanium layer;
regrowing a crystalline silicon layer over the silicon germanium layer using a solid phase epitaxy (SPE) process, the crystalline silicon layer being strained by a lattice mismatch between the silicon layer and the silicon germanium layer
forming a first diffusion region and a second diffusion region in the substrate, the first and second diffusion regions being separated by a channel region formed in the crystalline silicon layer;
forming a gate dielectric over the channel region; and
forming a gate over the gate dielectric.

34. The method of claim 33, wherein forming a first diffusion region and a second diffusion region in the substrate includes doping the substrate with n-type impurities to form the first and second diffusion regions.

35. The method of claim 34, wherein doping the substrate with n-type impurities to form the first and second diffusion regions includes doping a portion of the strained silicon and a portion of the silicon germanium layer with n-type impurities.

36. A method for forming a transistor, comprising:
forming a silicon germanium layer in a silicon substrate beneath a silicon layer in the substrate, including implanting germanium ions into the silicon substrate with a desired dose and energy to form the silicon germanium layer and at least partially amorphize the silicon layer over the silicon germanium layer;
further amorphizing the silicon layer over the silicon germanium layer, including implanting silicon ions with a desired dose and energy into the silicon layer over the silicon germanium layer;
regrowing a crystalline silicon layer over the silicon germanium layer using a solid phase epitaxy (SPE) process, the crystalline silicon layer being strained by a lattice mismatch between the silicon layer and the silicon germanium layer;
forming a first diffusion region and a second diffusion region in the substrate, the first and second diffusion regions being separated by a channel region formed in the crystalline silicon layer;
forming a gate dielectric over the channel region; and
forming a gate over the gate dielectric.

37. The method of claim 36, wherein forming a first diffusion region and a second diffusion region in the substrate includes doping the substrate with n-type impurities to form the first and second diffusion regions.

38. The method of claim 37, wherein doping the substrate with n-type impurities to form the first and second diffusion regions includes doping a portion of the strained silicon and a portion of the silicon germanium layer with n-type impurities.

39. A method for forming a transistor, comprising:
preparing a silicon substrate for germanium ion implantation, including implanting silicon ions at a desired dose and energy to amorphize the silicon substrate to a desired depth to discourage channeling;
forming a silicon region with a graded germanium ion content in a silicon substrate beneath a silicon layer in the substrate, including implanting germanium ions into the silicon substrate with a first desired dose and energy and a second desired dose and energy which at least partially amorphizes the silicon layer;
further amorphizing the silicon layer, including implanting silicon ions with a desired dose and energy into the silicon layer;
regrowing a crystalline silicon layer over a resulting silicon germanium layer using a solid phase epitaxy (SPE) process, the crystalline silicon layer being strained by a lattice mismatch between the silicon layer and the silicon germanium layer;
forming a first diffusion region and a second diffusion region in the substrate, the first and second diffusion regions being separated by a channel region formed in the crystalline silicon layer;
forming a gate dielectric over the channel region; and
forming a gate over the gate dielectric.

40. The method of claim 39, wherein forming a first diffusion region and a second diffusion region in the substrate includes doping the substrate with n-type impurities to form the first and second diffusion regions.

41. The method of claim 40, wherein doping the substrate with n-type impurities to form the first and second diffusion regions includes doping a portion of the strained silicon and a portion of the silicon germanium layer with n-type impurities.

42. A method of forming a memory array, comprising:
forming a plurality of memory cells in a silicon substrate, including arranging the memory cells in rows and columns and forming at least one transistor for each of the plurality of memory cells, wherein forming at least one transistor includes:
forming a silicon germanium layer in a silicon substrate beneath a silicon layer in the substrate, including implanting germanium ions into the silicon substrate with a desired dose and energy which at least partially amorphizes the silicon layer over the silicon germanium layer; and
regrowing a crystalline silicon layer using a solid phase epitaxy (SPE) process, the crystalline silicon layer being strained by a lattice mismatch between the silicon layer and the silicon germanium layer;
forming a plurality of word lines, including connecting each word line to a row of memory cells; and
forming a plurality of bit lines, including connecting each bit line to a column of memory cells.

43. The method of claim 42, wherein forming a silicon germanium layer includes forming the silicon germanium layer with a partially strained surface upon which the crystalline silicon layer is regrown.

44. The method of claim 42, wherein forming a silicon germanium layer includes forming the silicon germanium layer with a relaxed surface upon which the crystalline silicon layer is regrown.

45. The method of claim 42, further comprising:
before implanting germanium ions, preparing the silicon substrate to discourage germanium ion channeling; and
after implanting germanium ions and before annealing, further amorphizing the silicon layer.

46. A method for forming a memory device, comprising:
forming a memory array in a semiconductor substrate, including forming a plurality of memory cells in rows and columns and forming at least one transistor for each of the plurality of memory cells;
forming a plurality of word lines, including connecting each word line to a row of memory cells;
forming a plurality of bit lines, including connecting each bit line to a column of memory cells;
forming control circuitry in the semiconductor substrate, including forming word line select circuitry and bit line select circuitry for use to select a number of memory cells for writing and reading operations,
wherein at least one of forming the memory array and forming the control circuitry includes forming at least one transistor, including:
  implanting germanium ions into a silicon substrate with a desired dose and energy to form a silicon region containing germanium ions beneath a silicon layer in the substrate and to at least partially amorphize the silicon layer;
  annealing the substrate to regrow the silicon layer over a resulting silicon germanium layer such that the silicon layer is strained by a lattice mismatch between the silicon germanium layer and the resulting silicon germanium layer;
  forming a first diffusion region and a second diffusion region in the substrate, the first and second diffusion regions being separated by a channel region formed in the strained silicon layer;
  forming a gate dielectric over the channel region; and
  forming a gate over the gate dielectric.

47. The method of claim 46, further comprising:
before implanting germanium ions, preparing the silicon substrate to discourage germanium ion channeling; and
after implanting germanium ions and before annealing, further amorphizing the silicon layer over the silicon germanium layer.

* * * * *

UNITED STATES PATENT AND TRADEMARK OFFICE
CERTIFICATE OF CORRECTION

PATENT NO. : 6,987,037 B2
DATED : January 17, 2006
INVENTOR(S) : Forbes

It is certified that error appears in the above-identified patent and that said Letters Patent is hereby corrected as shown below:

Title page,
Item [56], References Cited, U.S. PATENT DOCUMENTS, after "Meyers," delete "Jr." and insert -- Jr., --; delete "438/31" and insert -- 438/311 --.
FOREIGN PATENT DOCUMENTS, after "9/1991" insert -- H01L/21/322 --.
OTHER PUBLICATIONS,
"Qinghua Xiao" reference, delete "et al," and insert -- et al., --; delete "Circuis" and insert -- Circuits --.
"Kal, S." reference, delete "et al," insert -- et al., --; delete "No." and insert -- Nos. --; delete "amd" and insert -- and --;
"Paine" reference, delete "et al," and insert -- et al., --;
"Auberton-Have, A J." reference, delete "Meeting," and insert -- Meeting. --;
"Berti, M." reference, delete "Si]xGEx/Si" and insert -- Si]-xGex/Si --;
"Clark, Don, et al." reference, delete "1/200th" and insert -- 1/2000th --;
"Codbole, H., et al." reference, delete "Spectroscophy" and insert -- Spectroscopy --;
"Gong, S S., et al." reference, after "30(2)" delete "." and insert -- , --;
"Graf, D., et al." reference, delete "Proceedings," and insert -- Proceedings. --;
"Herendt, Christine" reference, delete "Electronics" and insert -- Electronic --;
"Kung, C.Y., et al." reference, delete "Corp," and insert -- Corp., --;
"Loo, Y L. et al." reference, delete "with" and insert -- With --;
"Nuyak, D.K." reference, delete "Metting" and insert -- Meeting --;
"Nichols, F A." reference, delete "(interace)" and insert -- (interface) --;
"Verdonckt-vandebrock, Sophie, et al." reference, delete "Vandebroek,," and insert -- Vandebroek, --;
"Yang, D., et al." reference, delete "vo." and insert -- vol. --;
"Yin, Haizhou" reference, delete "Sil-xGex" and insert -- Si1-xGex --;
"Zhu, Z H., et al." reference, delete "device" and insert -- devices --.

Column 3,
Line 35, delete "mater." and insert -- matter. --.

Column 6,
Line 30, delete "implantion" and insert -- implantation --.

UNITED STATES PATENT AND TRADEMARK OFFICE
CERTIFICATE OF CORRECTION

PATENT NO. : 6,987,037 B2
DATED : January 17, 2006
INVENTOR(S) : Forbes

It is certified that error appears in the above-identified patent and that said Letters Patent is hereby corrected as shown below:

Column 15,
Line 23, after "layer" insert -- ; --.

Signed and Sealed this

Eighteenth Day of April, 2006

JON W. DUDAS
*Director of the United States Patent and Trademark Office*